United States Patent
Kim et al.

(10) Patent No.: US 6,813,804 B2
(45) Date of Patent: Nov. 9, 2004

(54) APPARATUS AND METHOD FOR CLEANING PROBE CARD CONTACTS

(75) Inventors: Byoung-Joo Kim, Yongin (KR); In-Seok Hwang, Suwon (KR); Ho-Yeol Lee, Seoul (KR); Soo-Min Byun, Yongin (KR); Hyung-Koo Kim, Kimpo (KR); Joon-Su Ji, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/162,675

(22) Filed: Jun. 6, 2002

(65) Prior Publication Data

US 2003/0226578 A1 Dec. 11, 2003

(51) Int. Cl.⁷ .............................. B08B 5/00; A47L 5/14
(52) U.S. Cl. .................... 15/306.1; 15/301; 15/319; 451/8
(58) Field of Search ................. 451/5, 6, 8, 527, 451/548, 9; 134/6, 7, 42; 15/306.1, 77, 88.2, 88.3, 102, 319, 301

(56) References Cited

U.S. PATENT DOCUMENTS

| | | | | |
|---|---|---|---|---|
| 5,524,676 A | * | 6/1996 | Scorl et al. ................. 139/1 C |
| 5,968,282 A | | 10/1999 | Yamasaka ....................... 134/6 |
| 5,998,986 A | | 12/1999 | Ido ........................... 324/158.1 |
| 6,019,663 A | * | 2/2000 | Angell et al. ................... 451/5 |
| 6,056,627 A | | 5/2000 | Mizuta ......................... 451/59 |
| 6,257,958 B1 | * | 7/2001 | Angell et al. ................... 451/9 |
| 6,271,676 B1 | * | 8/2001 | Montoya .................... 324/765 |
| 2002/0019196 A1 | | 2/2002 | Angell et al. | |

FOREIGN PATENT DOCUMENTS

| | | |
|---|---|---|
| JP | 07-244074 | 9/1995 |
| JP | 2000-019226 | 1/2000 |
| JP | 2000-174080 | 6/2000 |
| JP | 2000-332069 | 11/2000 |
| JP | 2002-176079 | 6/2002 |

\* cited by examiner

*Primary Examiner*—Randy Gulakowski
*Assistant Examiner*—Saeed Chaudhry
(74) *Attorney, Agent, or Firm*—Lee & Sterba, P.C.

(57) ABSTRACT

An apparatus and method for cleaning debris and residue from a multitude of electrical contacts of a test probe card of an integrated circuit test probe apparatus preferably comprises a silicon wafer having a grooved surface into which the test probe card is moved into pressurized contact. The grooved surface provides a grating structure that when combined with the pressurized electrical contacts will crush any intervening or attached residue particles, which will then break into smaller particles and fall away from the probe card. Pressure and relative movement of the probe card may be controlled by a variety of measurement sensors.

11 Claims, 4 Drawing Sheets

APPARATUS AND METHOD FOR CLEANING PROBE CARD CONTACTS

BACKGROUND OF THE INVENTION

1. Field of the Invention

The present invention relates to a cleaning apparatus for an integrated circuit (IC) testing apparatus, and more particularly to an apparatus for cleaning probe needles of an IC electrical test apparatus and method of use thereof.

2. Description of Related Art

In the manufacture of integrated circuits (ICs), a conventional method for acceptance testing of a manufactured wafer before dicing the chips typically uses a probe card, which is mounted on a test probe apparatus. When the probe card is brought into proximity with the wafer to be tested, each one of a multitude of electrical "needles" protruding from the probe card provide a tensioned electrical contact with a unique pad (electrode) formed on the individual IC chips on the wafer.

Due to the needle pressure being applied to the probe to provide satisfactory electrical contact with an aluminum portion of each IC pad, debris and residue, such as aluminum oxide particles, are scraped/created on the surface of the wafer. Such debris and residue adhere to both the chip and the probe, and after multiple successive tests, a probe can accumulate a significant amount of such debris and residue. The accumulated debris and residue typically exhibit low conductivity and inhibit good electrical contact between the test needles and the IC pads to be tested. Thus, to provide satisfactory testing, the probe needles require periodic cleaning to remove such debris and residue from the needles.

In a conventional apparatus, a resilient abrasive pad 40 is used to clean the test probe needles. As shown in FIG. 1, the test probe 20 is inserted into the pad 40, such that any debris and residue 101 attached to the needle tips 22 are removed by abrasive particles 42 in an elastic base material 41 located in the interior of pad 40, and any remaining smaller particle (dust film) that have static attachment to the tips of the needles 20 are collected by a surface dust cover 43 as probe 20 is withdrawn from the pad 40. A significant disadvantage of such a cleaning method is that the cleaning pads 40 are expensive and must be changed frequently as they become loaded/saturated with debris particles and residue 101.

SUMMARY OF THE INVENTION

According to a preferred embodiment of the present invention, an inexpensive test probe cleaning apparatus preferably comprises a grooved silicon wafer that serves as a breaker or anvil. When the breaker is mounted in a test cradle of a test probe apparatus in a manner similar to a manufactured wafer to be tested, application of normal test probe movement and pressure by a movement controlling means causes debris and residue that may be attached to any one of the multitude of test probe needles to be crushed and abraded between the needles and the breaker. The smaller particles that result from the crushing operation fall away from the test needles and into the grooves, preferably due to the force of gravity. Although they do not create an impedance problem, any debris or residue particles that may still remain on the test probe needles may be optionally removed or blown away using a directed quantity of pressurized gas.

Unprocessed silicon wafers are the preferred choice for the breaker substrate since they are inexpensive, have a same dimension as the wafers being tested, thereby not requiring special test probe calibration for conducting a cleaning process. Further, use of wafers allows for easy creation of the grooves or ridges in the upper surface via a simple grinding operation. A preferred profile of the grooves is a saw-toothed pattern, which would allow for hard, angled surfaces that will crush any debris, but will deflect the test probe needles slightly rather than expose them to damage that may result from using an un-yielding surface.

A preferable distance from the uppermost point to the lowermost cavity of the ridged surface is in a range of 0.5 microns to 5 microns, with a distance between a first peak and a second and adjacent peak of the ridged surface being in a range of 0.1 microns to 1.0 microns. For the foregoing dimensions, a preferred displacement of the test probe coming into contact with the breaking surface is about 500 microns. The movement controlling means may comprise a displacement means, such as a motors, gears, belts, and/or levers and one or more members from the group consisting of: an optical sensor, a pressure sensor, and a displacement sensor.

A method for using such a cleaning tool may comprise: 1) placing the ridged breaking apparatus in a wafer support cradle of the IC test probe apparatus; 2) applying force to move the probe needles into contact with the surface of the ridged breaking apparatus; 3) applying a predetermined additional force to move the needles past the outermost surface of the ridged breaking apparatus, such that any debris that is attached to the end of the plurality of probe needles is broken into smaller residual portions by the crushing action of the needle movement against the ridged breaking apparatus; 4) removing the smaller residual portions from the probe needles; and 5) removing the ridged breaking apparatus from the wafer support cradle of the IC test probe apparatus. The movement of the probe tips into contact with the breaker may be in an orthogonal direction or in a direction that is at an angle between about 90 to 135 degrees, more preferably about 103 degrees, relative to the top surface of the breaker, i.e. a scraping/abrading angle.

In an alternate embodiment, a method may feature the breaking apparatus being moved relative to a plurality of stationary probe needles. Such movement may be in an orthogonal direction or in a direction that is at an angle between about 90 to about 135 degrees, more preferably about 103 degrees, relative to the top surface of the breaker.

These and other features of the present invention will be readily apparent to those of ordinary skill in the art upon review of the detailed description that follows.

DETAILED DESCRIPTION OF THE INVENTION

In a preferred embodiment according to the present invention, a test probe-cleaning tool comprises a conventional silicon wafer having saw-toothed grooves ground into an upper surface. When a probe card of a test probe is brought into pressurized contact with the grooved surface of the wafer, any material residue that might be attached to a plurality of electrical conductors of the test probe (i.e. test needles) are crushed and/or abraded into smaller particles, which then fall away from the test needles.

Figure 1:
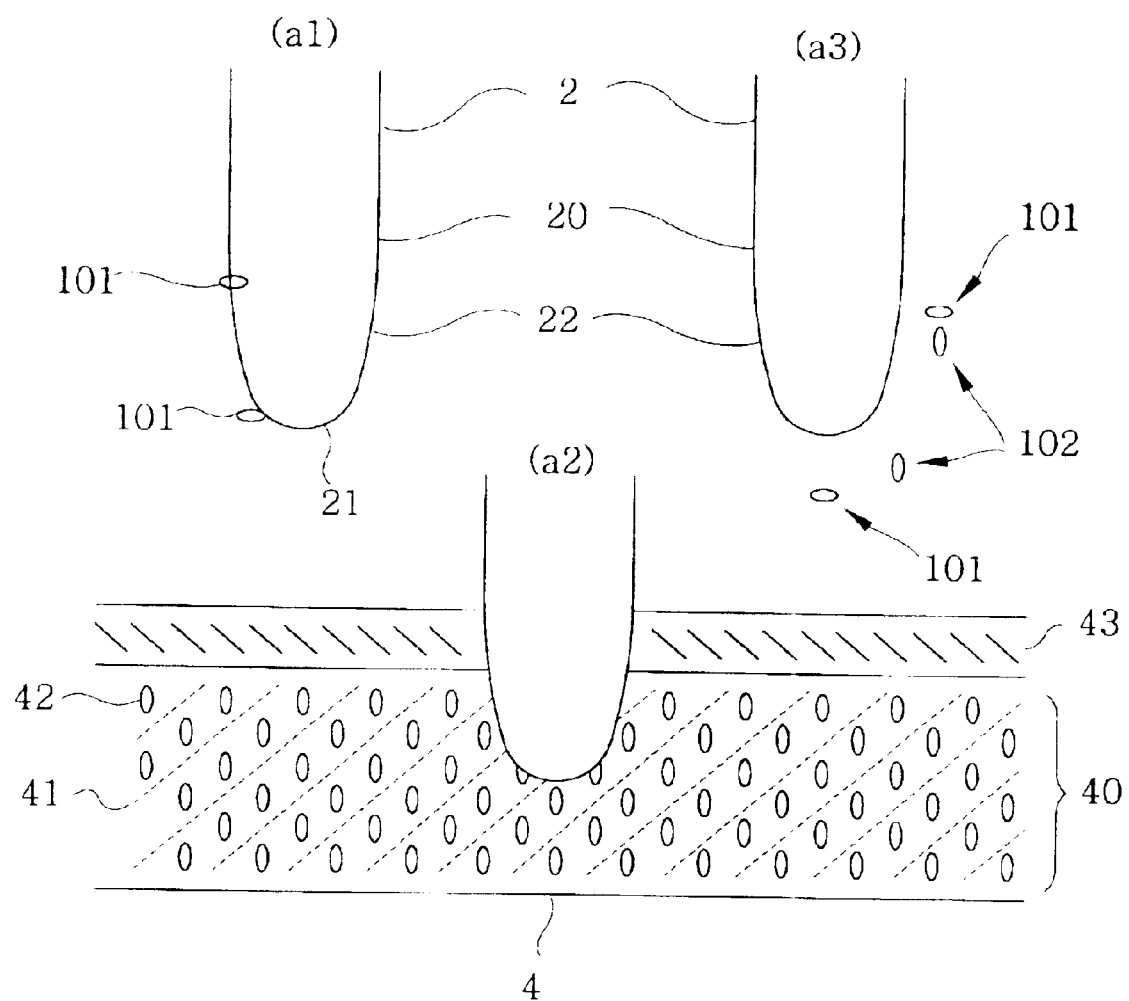
FIG. 1 illustrates a conventional apparatus for cleaning integrated circuit test probe needles.
Figure 2:
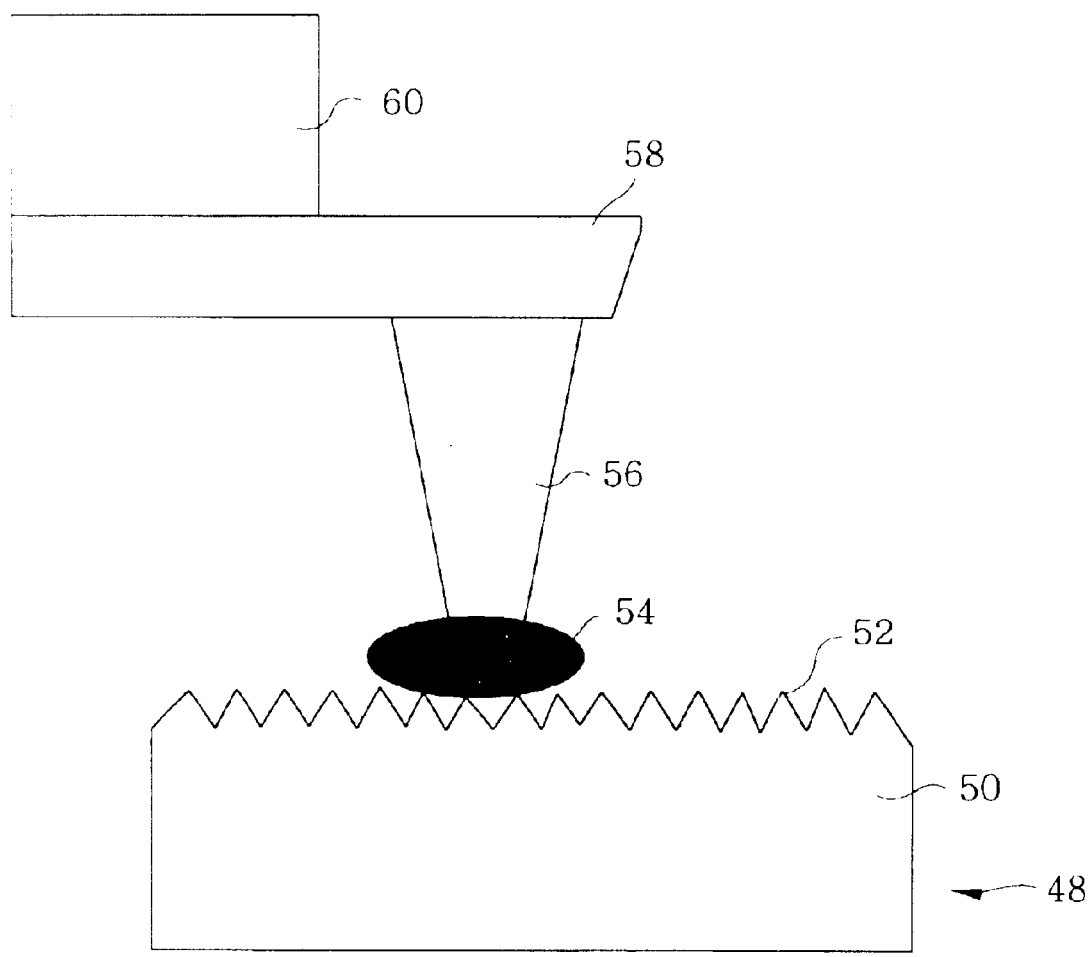
FIG. 2 illustrates a sectional view of a probe-cleaning tool according to the present invention.

FIG. 2 illustrates a sectional view of an embodiment of a probe-cleaning tool 48 according to the present invention. To create probe-cleaning tool 48, a surface of a conventional wafer 50 may be imbedded with grooves 52 to preferably create a saw-tooth configuration, as shown in FIG. 2. Selection of a conventional wafer 50 produces an inexpensive cleaning tool 48 that has a same thickness and diameter as the manufactured wafers being tested, thus eliminating any need for special calibration of the applied pressure or the test fixture. The grooves 52 can be created with a simple grinding operation to create a saw-toothed "breaking" surface, such as that shown in FIG. 2. An exemplary dimension of such a saw-tooth groove 52 might comprise a lateral distance between saw-tooth peaks in a range of 0.1 micron to 1.0 micron, with a preferable dimension being 0.3 to 0.5 micron. An associated depth of the saw-tooth groove might be within a range of 0.5 micron to 5.0 microns, with a preferable dimension being 1.0 to 4.0 micron. Further, for a probe tip having an exemplary diameter in the range of 10–30 microns, the displacement movement into contact with grooves 52 would preferably be about 500 microns. Such a displacement would apply for a probe having an angular orientation of between about 90 degrees and about 135 degrees, more preferably about 103 degrees, relative to the top surface of the saw-toothed wafer.

To minimize wear on the probe tip 56, an applied breaking force would preferably be less than a force of abrasion on the probe tip 56. Further, to insure that any wafer material attached to a test probe tip 56 is crushed and/or abraded and removed, the probe tip (needle) is preferably composed of a hard material, such as a tungsten alloy, and wafer 50 may be "hardened" to a degree that any residual debris or residue (i.e., conventional silicon wafer material) would be significantly more likely to be crushed, rather than the protruding saw-tooth tips of wafer 50.

As shown in FIG. 2, in the operation of the probe-cleaning tool 48, a probe tip 56 is brought into pressurized contact with the saw-toothed silicon wafer 50. Any debris particle and residue 54 that may be attached or secured to probe tip 56 would be subjected to a crushing and/or abrading pressure between the probe tip 56 of the probe card 58 of the test probe apparatus 60 and the grooved saw-toothed breaking surface of the cleaning wafer 50.

The saw-toothed silicon wafer 50 would be preferably placed in a test cradle of the test probe apparatus in a like manner as manufactured integrated circuit undergoing testing. The test probe apparatus 60 would preferably move probe card 58 having mounted thereon probe tip 56 having debris and residue to be cleaned to the crushing surface of the saw-toothed silicon wafer 50. The amount of pressure applied to crush and/or abrade the debris and residue particulate may be controlled by a variety of sensing devices, including pressure sensors, optical sensing devices, and lateral movement sensors. Movement of probe card 58 may be effected by a number of conventional mechanical and electrical movement means, such as appropriate combinations of motors, gears, belts, and levers, as are known in the art. In an alternate embodiment, the breaking apparatus may be moved into contact with stationary probe tips. In still another embodiment, the probe tip may be repeatedly (for example, 10 times) brought into contact with the breaking surface, depending on the properties of the wafer material being used and residue particles being generated.

Additionally, the probe tips may be roughened to improve electrical contact, although such step does not degrade the breaking and cleaning operation. Although the drawing figures and description feature a vertically moving probe card, various other conventional probe types, such as cantilever probes and needle probes, may also be satisfactorily used in accordance with the present invention.

The advantage of the present invention is that through the use of a conventional wafer having simple grooves, all the operations of a conventional test probe apparatus may be used without modification. This provides an inexpensive means for cleaning any accumulated debris. Further, as the cleaning tool 48 wears out, it can be easily and inexpensively replaced with a new one.

Figure 3:
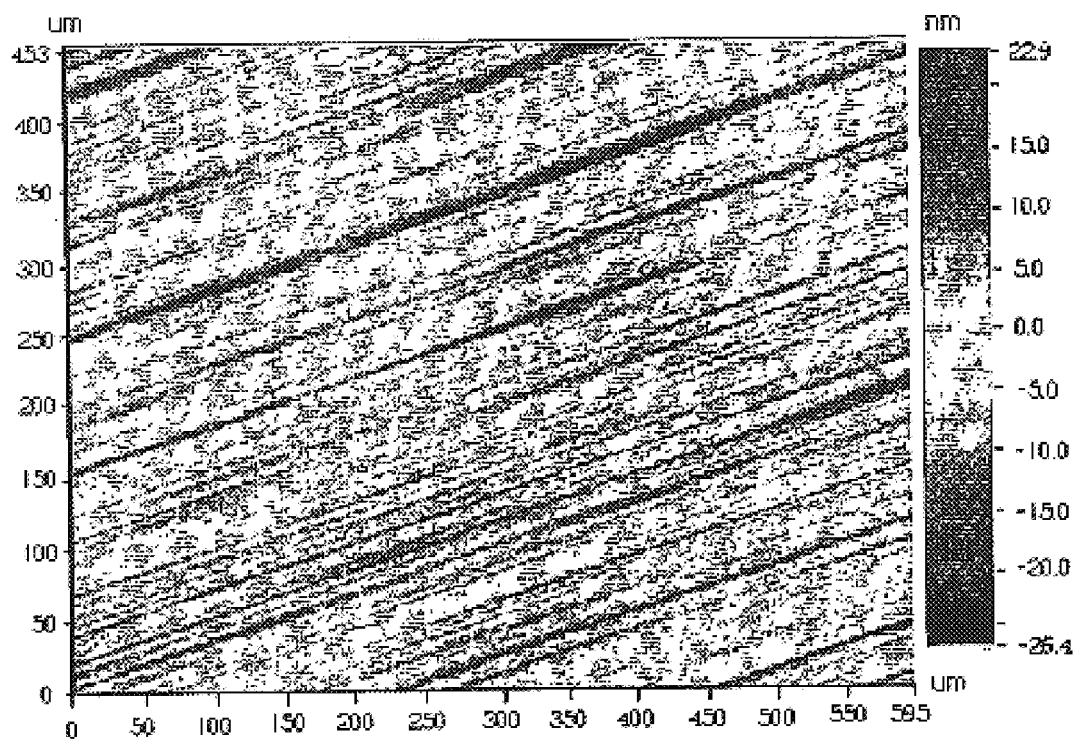
FIG. 3 illustrates a sectional view of an abrasive surface of the probe-cleaning tool shown in FIG. 2.

FIG. 3 illustrates a sectional view of an abrasive surface of the probe-cleaning tool shown in FIG. 2. Using conventional grinding techniques, the angled saw-tooth pattern may be realized. An advantage of a mechanical grinding operation is that the points of the saw-teeth will tend to be sharper than if the saw-teeth were created using a chemical process, such as etching. Although etching may be used as the groove-creation process, sharp edges desired for a breaking surface are difficult to attain.

Figure 4:
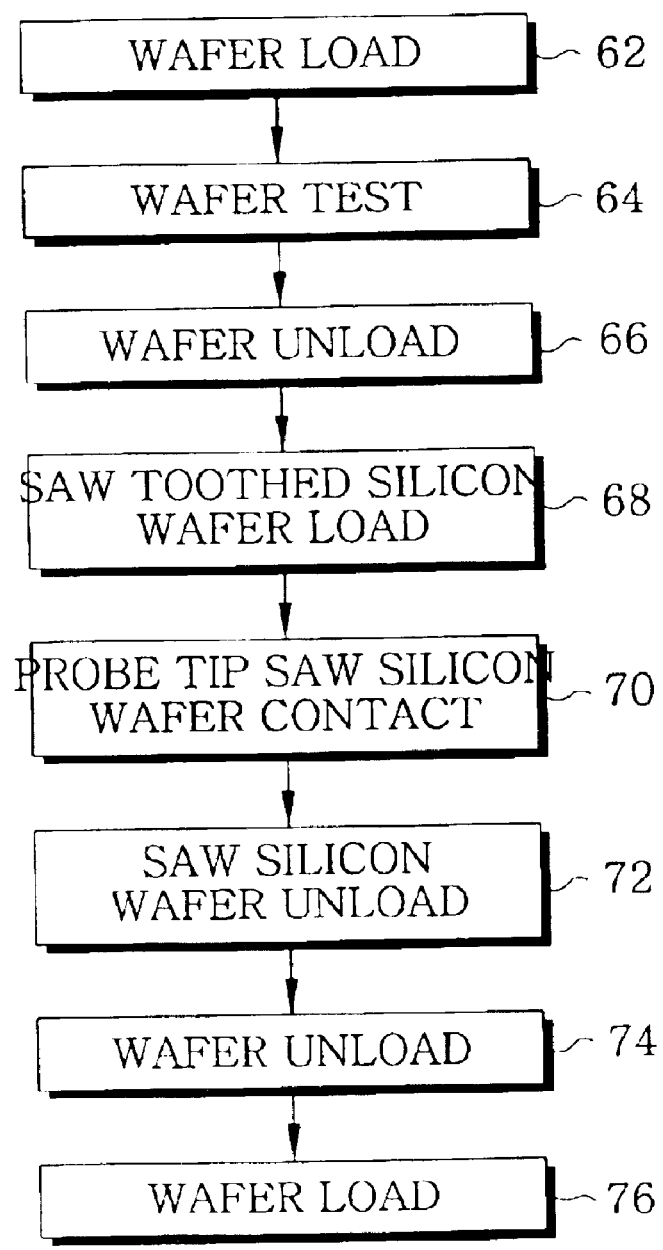
FIG. 4 illustrates a flow chart of the steps used by the embodiments of to the present invention.

FIG. 4 illustrates a flow chart showing the use of the cleaning tool 48 of the present invention. After a multitude of tests on manufactured IC wafers, a cleaning process 60 may be periodically inserted into the normal manufacturing test process. After a manufactured wafer is loaded, tested, and unloaded in steps 62, 64, and 66, respectively, the probe cleaning tool 48, consisting of saw-toothed silicon wafer 50 as shown in FIG. 2 is loaded into the test probe apparatus in step 68. Pressurized contact is applied in step 70 to crush and remove debris and residue, after which cleaning tool 48 is unloaded from the test probe apparatus in step 72. Wafer testing is resumed with the loading and testing of a next wafer in steps 74 and 76, respectively.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. An apparatus for cleaning a probe needle of an integrated circuit test probe apparatus, comprising:
    a generally flat rigid breaker having a ridged surface with a saw-toothed profile;
    a movement controlling means for moving the probe needle into contact with the breaker at a predetermined pressure; and
    a residue removal means.

2. The apparatus as claimed in claim 1, wherein the breaker is a silicon wafer.

3. The apparatus as claimed in claim 2, wherein the saw-toothed profile of the ridged surface is created by a grinding of the surface of the silicon wafer.

4. The apparatus as claimed in claim 1, wherein a distance from the uppermost point to the lowermost cavity of the ridged surface is between 0.5 microns and 5 microns.

5. The apparatus as claimed in claim 1, wherein a distance between a first peak and a second and adjacent peak of the ridged surface is between 0.1 microns and 1.0 microns.

6. The apparatus as claimed in claim 1, wherein a preferred displacement of a test probe coming into contact with the breaker is about 500 microns.

7. The apparatus as claimed in claim 1, wherein the movement controlling means includes a displacement means and one or more members from the group consisting of: optical sensor, pressure sensor, and displacement sensor.

8. The apparatus as claimed in claim 7, wherein the displacement means includes one or more members from the group consisting of a motor, a gear, a belt, and a lever.

9. The apparatus as claimed in claim 1, wherein the residue removal means is gravity.

10. The apparatus as claimed in claim 1, wherein the residue removal means comprises a pneumatic blowing means for dislodging and blowing away residual particles.

11. The apparatus as claimed in claim 1, wherein the movement controlling means moves a plurality of probe needles into contact with the breaker at a predetermined pressure.

* * * * *